US005633118A

United States Patent [19]

Burberry et al.

[11] Patent Number: 5,633,118

[45] Date of Patent: May 27, 1997

[54] LASER ABLATIVE IMAGING METHOD

[75] Inventors: Mitchell S. Burberry; Lee W. Tutt; Sharon W. Weber, all of Webster, N.Y.

[73] Assignee: Eastman Kodak Company, Rochester, N.Y.

[21] Appl. No.: 620,696

[22] Filed: Mar. 21, 1996

Related U.S. Application Data

[60] Provisional application No. 60/001,443, Jul. 26, 1995.

[51] Int. Cl. $^6$ .............................. G03C 1/73; G03F 7/12; G03F 7/36; G03F 7/40

[52] U.S. Cl. .......................... 430/292; 430/201; 430/324; 430/290; 430/964

[58] Field of Search .................................... 430/200, 201, 430/330, 292, 464, 324; 503/227

[56] References Cited

U.S. PATENT DOCUMENTS

| | | | |
|---|---|---|---|
| 5,360,781 | 11/1994 | Leenders et al. | 430/201 |
| 5,387,496 | 2/1995 | De Boer | 430/201 |
| 5,429,909 | 7/1995 | Kaszczuk et al. | 430/273 |
| 5,459,017 | 10/1995 | Topel et al. | 430/201 |
| 5,506,086 | 4/1996 | Van Zoeren | 430/201 |

*Primary Examiner*—Richard L. Schilling
*Attorney, Agent, or Firm*—Harold E. Cole

[57] ABSTRACT

A process of forming a single color image comprising:

a) imagewise exposing, by means of a laser, a dye-ablative recording element comprising a support having thereon, in order, a hydrophilic dye-receiving layer, a hydrophobic dye-barrier layer, and a hydrophilic, water-soluble, infrared-absorbing layer which absorbs at a given wavelength of the laser used to expose the element, thereby imagewise heating the infrared-absorbing layer and the dye-barrier layer, causing them to ablate;

b) removing the ablated infrared-absorbing layer and dye-barrier layer material;

c) contacting the imagewise-exposed element with an aqueous ink solution and thereby removing the remaining infrared-absorbing layer; and d) drying the element to obtain a single color image in the ablative recording element.

9 Claims, No Drawings

LASER ABLATIVE IMAGING METHOD

CROSS REFERENCE TO RELATED APPLICATION

Reference is made to and priority claimed from U.S. Provisional Application Ser. No. US 60/001,443, filed 26 Jul. 1995, entitled LASER ABLATIVE IMAGING METHOD.

This invention relates to process for obtaining a single color element for laser-induced, dye-ablative imaging and, more particularly, to a method for generating optical masks and monochrome transparencies used in graphic arts.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In one ablative mode of imaging by the action of a laser beam, an element with a dye layer composition comprising an image dye, an infrared-absorbing material, and a binder coated onto a substrate is imaged from the dye side. The energy provided by the laser drives off the image dye at the spot where the laser beam hits the element and leaves the binder behind. In ablative imaging, the laser radiation causes rapid local changes in the imaging layer thereby causing the material to be ejected from the layer. This is distinguishable from other material transfer techniques in that some sort of chemical change (e.g., bond-breaking), rather than a completely physical change (e.g., melting, evaporation or sublimation), causes an almost complete transfer of the image dye rather than a partial transfer. The transmission Dmin density serves as a measure of the completeness of image dye removal by the laser. Examples of this type of ablative imaging is found in U.S. Pat. No. 5,429,909, the disclosure of which is hereby incorporated by reference.

There is a problem with this ablative printing method is that a relatively thick dye layer must be coated to achieve an acceptable Dmax in unprinted areas, and in Dmin areas almost all of this dye must be removed by the heat of the laser. This requires relatively high exposures and concomitant high power laser print heads. These requirements result in low throughput and high system costs. It would be desirable to provide an imaging method which eliminates these problems.

In copending U.S. application Ser. No. 08/620,715, filed of even date herewith by Burberry and Tutt entitled, "LASER ABLATIVE IMAGING METHOD", a method is described in which an infrared-absorbing material is present in at least one of a hydrophilic dye-receiving layer, a hydrophobic dye-barrier layer, or layer therebetween coated on the substrate. In that process, the infrared-absorbing material is removed from the element only in the exposed areas. The infrared-absorbing material remains behind in the unexposed portions of the element which will contribute to the Dmin of the final image.

It is an object of this invention to provide a method of reducing the exposure needed to produce high contrast monocolor images. It is another object of this invention to provide a method for obtaining a laser ablative imaging element in which no residual infrared-absorbing material is retained after exposure.

These and other objects are achieved in accordance with the invention which relates to a process of forming a single color image comprising:

a) imagewise exposing, by means of a laser, a dye-ablative recording element comprising a support having thereon, in order, a hydrophilic dye-receiving layer, a hydrophobic dye-barrier layer, and a hydrophilic, water-soluble, infrared-absorbing layer which absorbs at a given wavelength of the laser used to expose the element, thereby imagewise heating the infrared-absorbing layer and the dye-barrier layer, causing them to ablate;

b) removing the ablated infrared-absorbing layer and dye-barrier layer material;

c) contacting the imagewise-exposed element with an aqueous ink solution and thereby removing the remaining infrared-absorbing layer; and d) drying the element to obtain a single color image in the ablative recording element.

In the process of the invention, the dye-ablative recording element is exposed by a laser which causes the hydrophilic, water-soluble, infrared-absorbing layer and the hydrophobic dye-barrier layer to be ablated, melted, pushed aside, or otherwise removed by laser heating, thereby uncovering the underlying hydrophilic dye-receiving layer. When the exposed element is brought into contact with an aqueous ink solution, the dye-receiving layer soaks up imaging dye from the solution preferentially in the exposed regions, thus providing a contrast difference between exposed and unexposed areas. During the dyeing step (or in a separate washing step before or after dyeing), the water-soluble, infrared-absorbing layer is washed away and with it all remaining infrared-absorbing material, which then will no longer contribute to the Dmin of the resulting image.

The advantage of this invention is that high contrast images with low Dmin can be achieved with much lower exposure than achievable with conventional dye ablation imaging. Another advantage of this invention is that high-contrast, monocolor images can be achieved with a low exposure to produce a negative-working image system. A negative-working system has an advantage when used in conjunction with another negative-working imaging material (such as when used as a mask for making printing plates or contact duplicates). In this case the background need not be exposed, thus saving time and energy for many images.

The hydrophobic dye-barrier layer employed in the invention can be made relatively thin since it does not contain image dyes and, therefore, requires little energy to be removed. This is in contrast to a thick dye layer used in conventional ablation films which requires more energy to be removed. For example, the dye-barrier layer can be from about 0.01 μm to about 5 μm in thickness, preferably from about 0.05 μm to about 1 μm.

The contrast between exposed and unexposed areas in the element can be controlled by variables, such as laser exposure, time of contact with the ink solution, concentration of the ink solution, thickness of the dye-receiving layer, and diffusion properties of the dye within the dye-receiving layer.

The process of the invention is especially useful in making reprographic masks which are used in publishing and in the generation of printed circuit boards. The masks are placed over a photosensitive material, such as a printing plate, and exposed to a light source. The photosensitive material usually is activated only by certain wavelengths. For example, the photosensitive material can be a polymer which is crosslinked or hardened upon exposure to ultraviolet or blue light but is not affected by red or green light. For these photosensitive materials, the mask, which is used to block light during exposure, must absorb all wavelengths which activate the photosensitive material in the Dmax regions and absorb little in the Dmin regions. For printing plates, it is therefore important that the mask have high UV Dmax. If it does not do this, the printing plate would not be developable to give regions which take up ink and regions which do not.

To obtain a laser-induced, ablative image using the process of the invention, a diode laser is preferably employed since it offers substantial advantages in terms of its small size, low cost, stability, reliability, ruggedness, and ease of modulation. In practice, before any laser can be used to heat an ablative recording element, the element must contain an infrared-absorbing material, such as pigments like carbon black, or cyanine infrared-absorbing dyes as described in U.S. Pat. No. 4,973,572, or other materials as described in the following U.S. Pat. Nos.: 4,948,777, 4,950,640, 4,950,639, 4,948,776, 4,948,778, 4,942,141, 4,952,552, 5,036,040, and 4,912,083, the disclosures of which are hereby incorporated by reference. The laser radiation is then absorbed into the hydrophilic, water-soluble light-absorbing layer and converted to heat by a molecular process known as internal conversion.

Lasers which can be used in the invention are available commercially. There can be employed, for example, Laser Model SDL-2420-H2 from Spectra Diode Labs, or Laser Model SLD 304 V/W from Sony Corp.

The dyes in the aqueous ink solution which can be used in the process of the invention can be any water-soluble dye known in the art, such as, for example, nigrosin black, crystal violet, azure c, azure a, acid red 103, basic orange 21, acriflavine, acid red 88, acid red 4, direct yellow 62, direct yellow 29, basic blue 16, lacmoid, litmus, saffron, rhodamine 6g. The above dyes are available from Aldrich Chemical Co.

The aqueous ink solution may be applied to the recording element by either bathing the element in a solution of the dye or applying the dye by a sponge, squeegee, roller or other applicator.

The hydrophobic dye-barrier layer material used in the invention can be, for example, nitrocellulose, cellulose acetate propionate, cellulose acetate, polymethylmethacrylate, polyacrylates, polystyrenes, polysulfones, polycyanoacrylates, etc. There can be included in this layer, for example, ablation enhancers such as blowing agents, e.g., azides, accelerators, e.g., 4,4'-diazidobenzophenone and 2,6-di(4-azidobenzal)-4-methylcyclohexanone, or the materials disclosed in U.S. Pat. No. 5,256,506.

The hydrophilic dye-receiving layer used in the process of the invention is a water-insoluble polymer such as a high molecular weight and/or crosslinked polymer, e.g., a high molecular weight and/or crosslinked gelatin, xanthum gum (available commercially as Keltrol T® from Kelco-Merck Co.), poly(vinyl alcohol), polyester ionomers, polyglycols, polyacrylamides, polyalkylidene-etherglycols, polyacrylates with amine, hydroxyl or carboxyl side groups, etc.

The hydrophilic, water-soluble, infrared-absorbing layer can contain an infrared-absorbing material and a polymeric binder such as, for example, a polymer having a sufficiently low molecular weight to render it water-soluble such as a low molecular weight gelatin, a poly(vinyl alcohol), a polyester ionomer, a polyglycol, a polyacrylamide, a polyalkylidene-etherglycol, a polyacrylate with amine, hydroxyl or carboxyl side groups, etc.

The infrared-absorbing material in the hydrophilic, water-soluble, infrared-absorbing layer can be a water-soluble infrared-absorbing dye such as IR-1 (shown hereinafter), Naphthol Green B (acid Green 1), Indocyanine green, sulfonated or carboxylated metal phthalacyanines, etc. The infrared-absorbing material can also be a pigment such as carbon black dispersed in the water-soluble binder. If desired, the hydrophilic, water-soluble, infrared-absorbing layer can just be the water-soluble infrared-absorbing dye alone without any binder.

Any material can be used as the support for the ablative recording element employed in the invention provided it is dimensionally stable and can withstand the heat of the laser. Such materials include polyesters such as poly(ethylene naphthalate); poly(ethylene terephthalate); polyamides; polycarbonates; cellulose esters such as cellulose acetate; fluorine polymers such as poly(vinylidene fluoride) or poly(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 μm. In a preferred embodiment, the support is transparent.

The following examples are provided to illustrate the invention.

EXAMPLE 1

The structural formulas of the materials referred to below are:

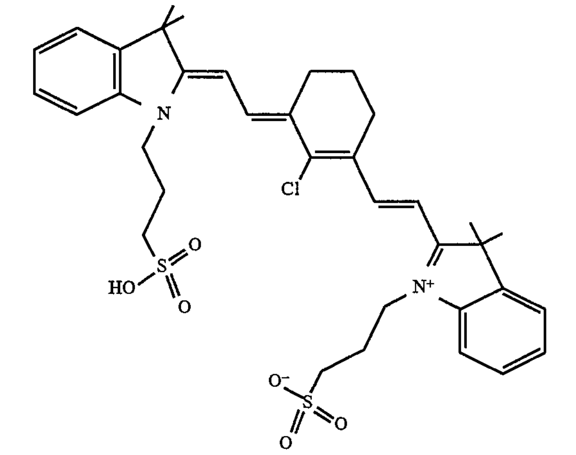

Infrared-Absorbing Dye IR-1

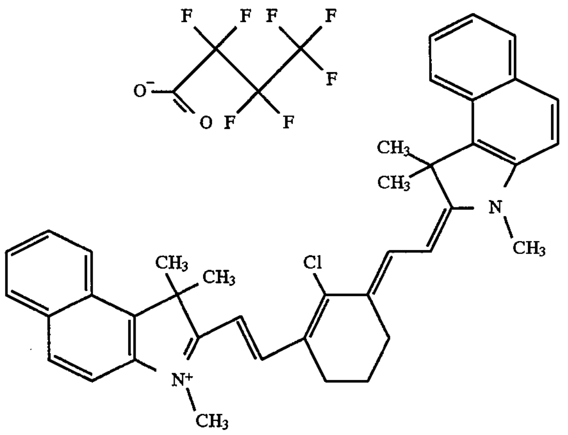

Infrared-Absorbing Dye IR-2

Control 1

A control coating of 0.054 $g/m^2$ of IR-2 with and without binder (Keltrol T®, a xanthum gum from Kelco-Merck & Co., Inc.) was coated on 100 poly(ethylene terephthalate) from Eastman Chemical Co. The Status A Red and Green densities were measured, as shown in the Table below.

Control 2

Dye-Receiving Layer

An aqueous coating was prepared by dissolving aqueous-compatible polymers (shown in the Table) in water, knife-coating the solution on 100 μm poly(ethylene terephthalate) support and drying to produce a dried coating containing 1.08 $g/m^2$ of polymer.

Dye Barrier Layer

Nitrocellulose (NC) (0.108 $g/m^2$) and 0.054 $g/m^2$ IR-2 absorber dye were coated from acetone over the dye-receiving layer as indicated in the Table.

Ten samples according to the invention were prepared as follows:

Dye-Receiving Layer

An aqueous coating was prepared by dissolving aqueous-compatible polymers (see Table) in water, knife-coating the solution on 100 μm poly(ethylene terephthalate) support and drying to produce a dried coating containing 1.08 $g/m^2$ of polymer.

Dye Barrier Layer

A solvent coating was prepared by dissolving solvent-compatible polymers in acetone and knife-coating the solution over the dye-receiving layer to produce a dried layer containing a weight of solid material as indicated in the Table.

Infrared-Absorbing Layer

A thin aqueous coating was prepared by dissolving IR-1 in water and knife-coating the solution over the dye-barrier layer (Samples 1–3 and 7). In Samples 4–6 and 8–10, aqueous-compatible polymers were added to the solution (see Table).

The samples were exposed using Spectra Diode Labs Lasers Model SDL-2432, having an integral, attached fiber for the output of the laser beam with a wavelength range of 800–830 nm and a nominal power output of 250 mW at the end of the optical fiber. The cleaved face of the optical fiber was imaged onto the plane of the element with a 0.5 magnification lens assembly mounted on a translation stage giving a nominal spot size of 25 μm. The drum, 53 cm in circumference, was rotated at 400 rev/min giving an exposure of 276 at $mJ/cm^2$. The translation stage was incrementally advanced across the film element by means of a lead screw turned by a microstepping motor, to give a center-to-center line distance of 10 μm (945 lines per cm, or 2400 lines per in.). An air stream was blown over the donor surface to remove the ablated material. The measured total power at the focal point was 100 mW.

TABLE

| Sample | Dye-Receiver Layer | Dye-Barrier Layer ($g/m^2$) | IR-Absorbing IR-1 ($g/m^2$) | Ink | Dmax (Dmin) Red | Dmax (Dmin) Green |
|---|---|---|---|---|---|---|
| Control 1 | | | 0.054 | | (0.251) | (0.034) |
| Control 2 | Keltrol T® | 0.108 NC + 0.054 IR-2 | | Nigrosin Black | 0.27 (.19) | 0.27 (0.14) |
| 1 | Keltrol T® | 0.216 NC | 0.054 | Crystal Violet | 0.547 (0.042) | 1.001 (0.082) |
| 2 | Keltrol T® | 0.432 NC | 0.054 | Crystal Violet | 0.329 (0.059) | 0.424 (0.088) |
| 3 | Keltrol T® | 0.864 NC | 0.054 | Crystal Violet | 0.235 (0.075) | 0.291 (0.098) |
| 4 | Keltrol | 0.086 NC | 0.054 + | Crystal | 0.640 | 1.171 |

TABLE-continued

| Sample | Dye-Receiver Layer | Dye-Barrier Layer ($g/m^2$) | IR-Absorbing IR-1 ($g/m^2$) | Ink | Dmax (Dmin) Red | Dmax (Dmin) Green |
|---|---|---|---|---|---|---|
| | T ® | | 0.086 PVA* | Violet | (0.052) | (0.058) |
| 5 | Keltrol | 0.086 NC | 0.054 + | Crystal | 0.26 | 0.326 |
| | T ® | | 0.054 Gel | Violet | (0.074) | (0.082) |
| 6 | Keltrol | 0.216 NC | 0.054 + | Nigrosin | 0.138 | 0.114 |
| | T ® | | 0.054 Gel | Black | (0.028) | (0.029) |
| 7 | Keltrol | 0.108 NC | 0.054 | Nigrosin | 0.289 | 0.289 |
| | T ® | | | Black | (0.151) | (0.137) |
| 8 | Keltrol | 0.108 NC | 0.054 + | Nigrosin | 0.400 | 0.387 |
| | T ® | | 0.054 Gel | Black | (0.137) | (0.121) |
| 9 | Keltrol | 0.108 NC | 0.054 + | Nigrosin | 0.524 | 0.521 |
| | T ® | | 0.086 PVA* | Black | (0.117) | (0.02) |
| 10 | Gel | 0.108 NC | 0.054 + | Nigrosin | 0.212 | 0.202 |
| | | | 0.054 Gel | Black | (0.124) | (0.115) |

*poly(vinyl alcohol) (88% hydroxyl) from Scientific Polymer Products. Inc.

The above results show that the unwanted red density from the IR absorber is practically eliminated when the IR-absorber is in a water-soluble topcoat. All examples show good contrast from inking.

By use of this invention, the hue associated with the IR dyes was removed from the background as illustrated by the comparison of the samples with Controls 1 and 2. Control 2 shows that unwanted hue due to the IR dye remains after processing in the background when the IR dye is not in a separate water-soluble top layer, as indicated by the higher red vs. green density in Dmin.

The invention has been described in detail with particular reference to preferred embodiments thereof, but it will be understood that variations and modifications can be effected within the spirit and scope of the invention.

What is claimed is:

1. A process of forming a single color image comprising:

a) imagewise exposing, by means of a laser, a dye-ablative recording element comprising a support having thereon, in order, a hydrophilic dye-receiving layer, a hydrophobic dye-barrier layer, and a hydrophilic, water-soluble, infrared-absorbing layer containing an infrared-absorbing material which absorbs at a given wavelength of said laser used to expose said element, thereby imagewise heating said hydrophilic, water-soluble, infrared-absorbing layer and said dye-barrier layer, causing them to ablate;

b) removing the ablated hydrophilic, water-soluble, infrared-absorbing layer and dye-barrier layer material;

c) contacting said imagewise-exposed element with an aqueous ink solution and thereby removing the remaining hydrophilic, water-soluble, infrared-absorbing layer; and d) drying said element to obtain a single color image in said ablative recording element.

2. The process of claim 1 wherein said hydrophilic, water-soluble, infrared-absorbing layer contains a water-soluble infrared-absorbing dye.

3. The process of claim 1 wherein said hydrophilic, water-soluble, infrared-absorbing layer contains a polymeric binder.

4. The process of claim 1 wherein said hydrophilic, water-soluble, infrared-absorbing layer is a water-soluble infrared-absorbing dye.

5. The process of claim 1 wherein said support is transparent.

6. The process of claim 1 wherein said dye-receiving layer is gelatin.

7. The process of claim 1 wherein said dye-receiving layer is xanthum gum.

8. The process of claim 1 wherein said dye-barrier layer is cellulose acetate propionate.

9. The process of claim 1 wherein said dye-barrier layer is nitrocellulose.

* * * * *